United States Patent [19]

Pommer, II

[11] Patent Number: 4,613,768

[45] Date of Patent: Sep. 23, 1986

[54] TEMPERATURE DEPENDENT, VOLTAGE REFERENCE COMPARATOR/DIODE

[75] Inventor: Karl E. Pommer, II, Huntsville, Ala.

[73] Assignee: GTE Communication Systems Corp., Northlake, Ill.

[21] Appl. No.: 670,508

[22] Filed: Nov. 13, 1984

[51] Int. Cl.[4] .......................................... H03K 5/153
[52] U.S. Cl. .................................. 307/350; 307/363;
307/310; 307/296 R
[58] Field of Search ............... 307/350, 362, 363, 302,
307/310, 318, 296 R

[56] References Cited

U.S. PATENT DOCUMENTS

| | | | |
|---|---|---|---|
| 3,523,198 | 8/1970 | Keller | 307/318 |
| 3,586,879 | 6/1971 | Ford | 307/318 |
| 3,628,070 | 12/1971 | Heuner et al. | 307/362 |
| 4,290,005 | 9/1981 | Arumugham | 307/318 |

*Primary Examiner*—John Zazworsky
*Attorney, Agent, or Firm*—Robert J. Black

[57] ABSTRACT

A precise temperature dependent voltage reference and voltage comparator comprising a three terminal circuit. When the input voltage exceeds a predetermined threshold, the output switches from the nonconducting, "off" state to a current conducting "on" state. The threshold condition can be tailored to a specific temperature characteristic and low voltage range with an input current on the order of 25 microamperes. With the output tied to the input, the circuitry can act as a reference diode.

9 Claims, 1 Drawing Figure

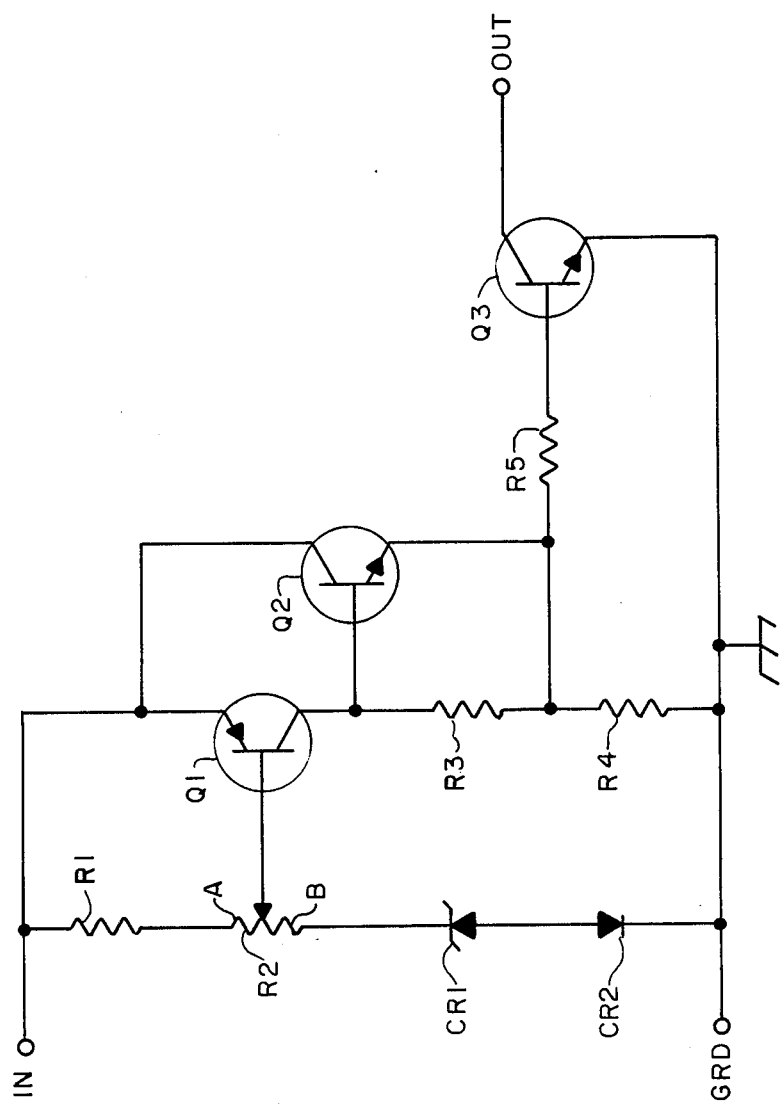

TEMPERATURE DEPENDENT, VOLTAGE REFERENCE COMPARATOR/DIODE

BACKGROUND OF THE INVENTION

1. Field of the Invention

The present invention relates to precise, temperature-dependent voltage references and to voltage comparators and more particularly to a combination circuit useful in temperature and voltage sensitive applications that involve an analog input signal and a relationship to some predetermined threshold condition.

2. Background Art

The combination of a voltage reference circuit and a voltage comparator circuit has been utilized in numerous applications. As a stand-alone circuit, it is used as a voltage threshold detector. The output from such circuitry may be used to generate a logic signal indicating either an over or under reference voltage condition. Such signals are useful in signal processing applications to convert an analog signal to a digital signal based on a precise threshold voltage definition. However, the usual comparator circuitry's high gain difference voltage amplifier can also be used to control a process. In a series voltage regulator, for example, the combination may be used to control the flow of current through a series pass stage coupled between a direct current energy source and the regulated voltage output. In such applications, priority is heavily centered on the generation and utilization of the standard direct current supply voltages (5 volts, 12 volts and 15 volts). The voltage needs of a bipolar integrated circuit over the operating temperature extremes, however, has forced such designs to be nearly temperature independent.

Voltage references have long been a key concept in the development of complex circuits and systems. Ideally, the voltage reference device exhibits a fixed voltage independent of both temperature and current flow. In standard practice, this is easily achieved by placing a temperature compensating forward biased diode in series with a 5.6 volt zener diode. The forward biased diode, for example a 1N4148, exhibits a temperature coefficient of approximately minus 2.2 microvolts per degree centrigrade and exhibits a gradual breakdown voltage which is a logarithmic function of the diode current. The 5.6 volt zener diode, for example a 1N5232, exhibits a positive temperature coefficient of between plus one and plus two and one-half millivolts per degree centigrade and an abrupt breakdown voltage characteristic. Alternately, a band gap, integrated circuit voltage reference, for example National Semiconductor's LM185H-1.2 can be used. Such implementations exhibit an abrupt breakdown voltage (typically 1.235 volts) and a significant lack of temperature dependence (typically 0.025 millivolts per degree centigrade). This voltage, in turn, may be adjusted to a different value using an operational amplifier such as that manufactured by National Semiconductor under their part no. LM346N. Both of these functions are represented in National's part no. LM10CLN. Unfortunately, the same gain used to multiply the reference voltage also multiplies the temperature coefficient of the voltage reference. The next closest approximation to the idealized voltage reference is represented by National's LM103H-1.8 to LM103H-5.6 series of integrated circuit reference diodes covered by U.S. Pat. No. 3,571,630. These devices approach the idealized behavior of a temperature dependent, voltage reference in the voltage range between 1.8 and 5.6 volts. Each of these devices exhibit abrupt breakdown voltage characteristic with a fixed temperature coefficient, typically of minus 5 millivolts per degree centigrade. The poorest approximation to a voltage reference device in this voltage range is represented by the 1N5211-to 1N5231 series of zener diodes. Here the current versus voltage characteristics exhibit the gradual breakdown voltage associated with a zener conduction current mechanism. Also, the temperature coefficient is negative, ranging from zero to minus three millivolts per degree centigrade. However, these zener diodes can be used as a temperature dependent voltage reference if the zener diode's current flow is regulated within the required limits. Furthermore with the series addition of a positive temperature coefficient compensating thermister for example, the "tempsistor" made by Midwest Components Incorporated, the temperature dependence of the reference can be made insignificant. The 25° C. resistance values in this series of devices exhibit a positive temperature coefficient resistance in the vicinity of 0.75% per degree C. for the zero to 50° C. range. Tolerances of purchased items on the 25° C. resistance are available from one to 10 percent.

The voltage comparator function is generally performed by an integrated circuit such as National Semiconductor's LM393N. This is a low power, low offset voltage device containing two independent precision voltage comparators. It is designed to operate from a single power supply of between 2 and 36 volts D.C. with a typical supply current of 0.4 milliamperes. The two input voltages to the comparator are limited to the common mode range of between zero volts and the supply voltage less 1.5 volts. The small signal response time is on the order of 1.3 microseconds with a voltage gain in excess of 50 volts per millivolts. Both the supply current and common mode range requirements are objectionable in battery powered, low voltage applications.

The supply current required for the voltage comparator function can be significantly reduced by the selection of an operational amplifier integrated circuit. In this situation, the output must be coupled to the base emitter diode of an NPN transistor due to limitations on the output voltage swing and/or the current sinking abilities of such devices. The NPN transistor's collector acts as the new output and the polarity of the operational amplifier's inputs are then reversed. Recently a device manufactured by Texas Instrument under their part no. TLC251 (a CMOS operational amplifier) operates with a supply current of below thirty microamperes. Unfortunately, the common mode restrictions still limit the maximum input voltage to some voltage less than the supply voltage.

Many of the present designs which combine the voltage reference and voltage comparator functions appear to be limited to the area of low power operation. Thus none of the normal circuitry seems to be able to provide a simple, low cost, low voltage circuit involving only a maximum of three terminals, a specific temperature coefficient (such as minus 7 millivolts per degree centigrade) and a precision threshold voltage adjustment. Accordingly the object of the present invention is to provide a low cost, low power, three terminal circuit which responds as a function of the difference between a given input voltage and a lesser predetermined temperature dependent reference voltage. This response permits the output to act as a difference voltage dependent current sink for threshold voltage detection in power supply applications. Such an arrangement can also be used to implement a voltage reference diode by shorting the input and output terminals together.

SUMMARY OF THE INVENTION

The present invention comprises a combination of three individual subcircuits; a current source, a temperature-dependent voltage reference and a voltage comparator interconnected in such a manner so as to provide the desired functions.

In the present invention the current source is defined by the emitter-base diode of a PNP transistor and a shunting resistance composed of a first resistor in a series with a variable resistance. This resistance is formed by one side of a variable, second resistor whose resistive tap is connected to the aforementioned PNP transistor's base which also acts as the output node of the current source. The PNP transistor's emitter is necessarily connected to the signal input terminal to power the circuit.

The temperature-dependent voltage reference is connected to the base of the PNP transistor. From this point it consists of the remaining resistance connected within the aforementioned variable resistor from the resistance tap to its other terminal, a low voltage zener diode and a forward biased silicon diode. Each of these three devices are serially connected to the circuit ground.

The voltage comparator portion of the circuitry consists of the aforementioned PNP transistor whose inputs are represented by its base and emitter terminals. The PNP transistor's collector is directly connected to the base of a first NPN transistor. The NPN transistor's collector is connected to the signal input terminal. The base and emitter leads of the NPN transistor are shunted by a third resistor. Furthermore, the NPN transistor's emitter is connected to both a fourth resistor wired to circuit ground and a fifth resistor coupled to the base of a common emitter connected, second NPN transistor. The collector of this last transistor is tied to the output terminal of the three terminal circuit of the present invention.

The invention may be wired to perform two entirely different functions. As a three terminal circit, it acts as a low power, temperature-dependent, voltage reference comparator. Here the output terminal acts as an input voltage dependent current sink whenever the input voltage exceeds the threshold voltage defined by the variable resistor's effect on the circuit. Below this threshold, the output circuit exhibits a nonconducting state. The invention can also perform the function of a voltage reference diode. In this case the input and output terminals are connected so that the circuit exhibits an adjustable abrupt breakdown voltage versus current characteristic.

The PNP transistor performs the function of a difference voltage detector based on the logarithmic relationship which exists between the emitter base voltage and the flow of collector current. At the threshold conditioned for the circuit, the emitter base voltage divided by the aforementioned shunting resistance defines a current source for the aforementioned voltage reference circuit. As a result the input threshold voltage, is the sum of the PNP transistor's emitter base voltage and each of the voltage drops in the voltage reference circuit. The variable resistance, within these two circuits, defines a means of precisely adjusting the input threshold voltage at a given temperature. The threshold voltage's temperature coefficient is defined by the sum of the individual temperature coefficients due to the PNP transistor's emitter base diode and the voltage reference circuit's diode, zener and resistive components, contributed by the aforementioned variable resistor.

The collector current from the first (PNP) transistor difference voltage detector is amplified by the second (NPN) transistor. The resulting current is used to drive the third (NPN) transistor in the output circuit. The third and fourth resistors, are used to define the collector current of the PNP transistor at the threshold condition of the circuit, which the fifth resistor limits the input current at voltages exceeding the threshold condition for the circuit.

DESCRIPTION OF THE DRAWING

The single FIGURE of the attached drawing is a schematic diagram of a three terminal temperature-dependent voltage reference and voltage comparator.

DESCRIPTION OF THE PREFERRED EMBODIMENT

The three terminal circuit, shown in the attached drawing, is comprised of three bipolar transistors, five resistors, a zener diode and a silicon diode. The three transistors Q1, Q2 and Q3 are interconnected with three of these resistors R3, R4 and R5 to form a voltage comparator. The PNP transistor Q1 has its base emitter diode shunted by resistor R1 and the "A" portion of resistor R2 for the implementation of a current source. A temperature-dependent voltage reference is formed by the remaining components; that is to say the "B" portion of resistor R2, a low voltage zener diode CR1 and a forward biased silicon diode CR2.

The three terminal circuit represents implementation of a voltage reference comparator. The input signal which also powers the circuit is connected between the IN terminal and GRD. The output terminal OUT, acts as a current sink to the circuit GROUND when the input signal exceeds a predetermined threshold voltage. This response can also be used to implement a voltage reference diode which exhibits an abrupt breakdown voltage versus current characteristics by simply connecting the input terminal IN and output terminal OUT.

In the present circuit the PNP transistor Q1 performs the function of a difference voltage detector based on the logarithmic relationship, described by the Ebers-Moll model, between the emitter base voltage of transistor Q1 and the resulting collector current exhibited by this transistor. When the input voltage at terminal IN equals the threshold voltage of the circuit, the collector current of transistor Q1 causes the output transistor Q3 to initiate the conduction of collector current through output terminal OUT. As a result a unique emitter base voltage is defined at a given temperature for the threshold condition. Similarly the input threshold voltage can be related to the reference voltage applied to the base of transistor Q1.

The intermediate NPN transistor Q2 functions as a current amplifier between the voltage detector transistor Q1 and the output transistor Q3. Resistor R3 shares the collector current from transistor Q1 with the base of transistor Q2. Similarly resistor R4 shares the output current provided by resistor R3 and the emitter of transistor Q2 with the base of the output transistor Q3. As a result the collector current of transistor Q1 tends to be fixed at a predefined value in the vicinity of the threshold condition. This value can be approximated by the base emitter voltage of transistor Q2 divided by resistor R3. This also tends to fix the emitter base voltage of transistor Q1 at a predefined value for input voltages within this vicinity. Further increases in the input voltage will, of course, increase both the output current and the emitter base voltage of transistor Q1.

The NPN output transistor Q3 acts as a current sink for the output terminal OUT. The current conducted by this collector circuit is defined by the emitter voltage of transistor Q2, resistor R5 and the electrical characteristics of transistor Q3. Resistor R5 serves also to limit the input current from terminal IN as the input voltage increases above the circuit threshold voltage. The combination of both resistor R5 and resistor R4 serve to limit the offstate leakage current in the output circuit when the input voltage is less than the circuit threshold voltage.

The PNP transistor Q1 and the shunting emitter base resistance form a current source for the voltage reference. The shunting resistance is composed of resistor R1 and the top portion "A" of potentiometer R2. The characteristic value of the emitter base voltage of transistor Q1 at the threshold condition divided by the shunting resistance, approximates the bias current supplied to the voltage reference.

The circuit can be designed to allow the use of low cost potentiometers for resistor R2 as a means of adjusting the input threshold voltage. This technique permits large variations in the temperature coefficient of resistance based on the matched behavior of section A and section B of potentiometer R2. In this case, the value of potentiometer R2 is made significantly greater than twice the value of resistor R1 in order to minimize any difference in their behavior. If, for example, the potentiometer R2 is set to its midpoint with the A and B sections being equal, then potentiometer R2 assumes the behavior of 1.9 series connected diodes, each equivalent to the emitter base diode of transistor Q1. Alternately, potentiometer R2 could be adjusted so that the B section is equal to one-quarter of the total value of potentiometer R2, and then at that time potentiometer R2 would approximate the behavior of 1.3 series connected diodes. Obviously, such an adjustment range would permit an input threshold voltage adjustment range of about 0.3 volts. The associated temperature coefficient adjustment range is approximately 1.3 millivolts per degree centigrade. Furthermore, the first adjustment represents a 45 percent decrease in bias current, relative to the second adjustment to the voltage reference circuit. The B section of potentiometer R2 also provides the additional function of limiting the base input current through terminal IN when the input voltage exceeds the threshold voltage.

The voltage reference has been defined as the circuit attached to the base of transistor Q1. This circuit, in conjunction with the emitter-base diode of transistor Q1, defines the input threshold voltage and its temperature characteristics. In addition to resistors such as R2 (the B section), suitable devices for the circuit include forward biased diodes, zeners and thermistors (for example the "Tempsistor" made by Midwest Components Incorporated). The series circuit shown in accompanying drawing however is limited to the "B" portion of potentiometer R2, a low voltage zener diode CR1 and a silicon diode CR2. The gradual breakdown voltage with bias current of these two diodes forms an additional part of the input voltage adjustment process. The change in bias current accompanying the voltage adjustment of potentiometer R2, further increases the adjustment range of the input threshold voltage without effecting an additional change in the temperature characteristic. A zener diode such as a 1N4618, has a temperature coefficient of between minus 1 millivolt per degree centigrade to minus 3 millivolts per degree centigrade. The silicon diode, for example a 1N4148, exhibits a negative temperature coefficient in the range of 2.2 millivolts per degree centigrade. Summing each of the individual temperature coefficients, the temperature coefficient for the input threshold voltage has a calculated value in the vicinity of minus 7 millivolts per degree centigrade. Obviously a different set of voltage dropping elements within the voltage reference circuit could be used to tailor the input threshold voltage for a different temperature and voltage characteristic.

While but a single embodiment of the present invention has been shown it will be obvious to those skilled in the art that numerous modifications may be made to the present circuitry without departing from the spirit and scope of the present invention which will be limited only by the scope of the claims appended hereto.

I claim:

1. A combined temperature dependent voltage reference and voltage comparator circuit comprising: an input; a current source comprising the base-emitter diode of a first transistor, and adjustable resistance means connected between said input and said first transistor base; voltage reference means comprising a temperature dependent voltage reference including first and second oppositely poled unidirectional conducting means connected to said first transistor base by means of a variable resistance; a differential voltage detector including a portion of said current source; output means; and current amplifier means connected between said voltage detector and said output means; said circuit operated in response to a voltage applied to said input being equal to a predetermined threshold voltage, to cause said detector to initiate the conduction of current through said output means.

2. A combined temperature dependent voltage reference and voltage comparator circuit as claimed in claim 1 wherein: said differential voltage detector comprises said first transistor.

3. A combined temperature dependent voltage reference and voltage comparator circuit as claimed in claim 2 wherein said first transistor is of the PNP type.

4. A combined temperature dependent voltage reference and voltage comparator circuit as claimed in claim 1 wherein: said output means comprise an output terminal connected to the collector of a second transistor.

5. A combined temperature dependent voltage reference and voltage comparator circuit as claimed in claim 4 wherein: said second transistor is of the NPN type.

6. A combined temperature dependent voltage reference and voltage comparator circuit as claimed in claim 4 wherein: said current amplifier means comprises a third transistor.

7. A combined temperature dependent voltage reference and voltage comparator circuit as claimed in claim 6 wherein: said third transistor is of the NPN type.

8. A combined temperature dependent voltage reference and voltage comparator circuit as claimed in claim 1 wherein: there is further included base current limiting means including circuit connections to said first transistor.

9. A combined temperature dependent voltage reference and voltage comparator circuit as claimed in claim 1 wherein: there is further included leakage current limiting means including circuit connections to said output means and to said current amplifier means.

* * * * *